United States Patent [19]

Zagar

[11] Patent Number: 5,270,587
[45] Date of Patent: Dec. 14, 1993

[54] CMOS LOGIC CELL FOR HIGH-SPEED, ZERO-POWER PROGRAMMABLE ARRAY LOGIC DEVICES

[75] Inventor: Paul S. Zagar, Boise, Id.

[73] Assignee: Micron Technology, Inc., Boise, Id.

[21] Appl. No.: 817,167

[22] Filed: Jan. 6, 1992

[51] Int. Cl.$^5$ ...................... H03K 19/094; G06F 7/38
[52] U.S. Cl. .................... 307/469; 307/242; 307/451
[58] Field of Search ............... 307/469, 451, 452, 465, 307/471, 481, 242, 243; 364/716

[56] References Cited

U.S. PATENT DOCUMENTS

| | | | |
|---|---|---|---|
| 3,252,011 | 5/1966 | Zuk | 307/471 |
| 4,286,174 | 8/1981 | Dingwall | 307/242 |
| 4,695,740 | 9/1987 | Carter | 307/242 |
| 4,713,557 | 12/1987 | Carter | 307/242 |
| 4,835,418 | 5/1989 | Hsieh | 307/242 |
| 5,027,012 | 6/1991 | Saeki et al. | 307/469 |
| 5,053,646 | 10/1991 | Higuchi et al. | 307/465 |
| 5,148,391 | 9/1992 | Zagar | 307/451 |

*Primary Examiner*—Edward P. Westin
*Assistant Examiner*—Richard Roseen
*Attorney, Agent, or Firm*—Angus C. Fox, III

[57] ABSTRACT

A CMOS logic cell, which may be readily arrayed to construct fast, zero-power programmable array logic (PAL) devices or field-programmable logic array (FPLAs) is disclosed. The cell is constructed from first and second pairs of P-channel insulated-gate field effect transistors (IGFETs), and first and second pairs of N-channel IGFETs. Each pair of P-channel IGFETS is connected in series between an output node and $V_{cc}$, while each pair of N-channel IGFETS is connected in series between the output node and $V_{ss}$. The gate of one transistor of the first P-channel IGFET pair is connected to the output of a first memory cell, while the gate of the other transistor of the same pair is connected to an input signal I; the gate of one transistor of the second P-channel IGFET pair is connected to the output of a second memory cell, while the gate of the other transistor of the same pair is connected to signal I* (the complement of input signal I). Likewise, the gate of one transistor of the first N-channel IGFET pair is connected to the output of the first memory cell, while the gate of the other transistor of the same pair is connected to signal I*; the gate of one transistor of the second N-channel IGFET pair is connected to the output of the second memory cell, while the gate of the other transistor of the same pair is connected to signal I. Each of the memory cells may be programmed to provide either a CMOS logical 1 or 0 output, and may be either nonvolatile or volatile.

25 Claims, 10 Drawing Sheets

CMOS LOGIC CELL FOR HIGH-SPEED, ZERO-POWER PROGRAMMABLE ARRAY LOGIC DEVICES

FIELD OF THE INVENTION

This invention relates to programmable logic arrays constructed from a novel CMOS logic cell constructed from a pair of tristate inverters.

BACKGROUND OF THE INVENTION

A Programmable Logic Device (PLD) is a user-configurable logic device that performs a function on input data so as to produce desired output data. The PLD is configured (programmed) by applying a series of voltage pulses to memory cells within the device. There are many types of PLDs, each optimized to perform a specific logic function within given performance parameters.

One type of PLD, known as a Programmable Read-Only Memory (PROM), became available in the early 1970s. The primary uses of PROMs have been in memory-type applications, such as display look-up tables, and software storage known as firmware. Referring now to FIG. 1, PROMs comprise programmable OR array 11 fed by a fixed AND array 12. The AND array is fully decoded, meaning that all possible combinations of the inputs $I_0 \ldots I_2$ have a unique product term. As a result of the full decoding scheme, which results in $2^n$ product terms, where n is the number of inputs, PROMs are typically relatively large and costly devices. In addition, PROM devices tend to be slower than other PLDs, due to the switching time of the large arrays. Only some small PROMs operate fast enough to be useful as logic elements.

In the mid 1970s, a new type of PLD, known as the Field Programmable Logic Array (FPLA), was devised. Referring now to FIG. 2, it will be noted that an FPLA has a basic structure similar to that of a PROM. However, both its AND array 21 and OR array 22 are programmable. The fact that the AND array is not dully decoded results in a device that is smaller, faster and better able to handle logic functions than PROMs. FPLAs are extensively used in applications where output functions are very similar, allowing full utilization of the shared product terms. Although FPLAs were initially considered somewhat slow and costly, new technology is changing that perception.

In the late 1970s, another type of PLD, known as the Programmable Array Logic (PAL) device, debuted. Referring now to FIG. 3, it will be noted that the basic structure is shared with PROMs and FPLAs. However, this time, the AND array 31 is programmable and the OR array 32 is fixed. The quantity of product terms per output is fixed by the hardwired OR array. Compared to PROMs and FPLAs, PALs offer improved performance and more efficient architecture for most logic functions.

In FIG. 4, a conventional method of implementing the programmable AND terms in either a PAL or an FPLA. For simplicity, the nonvolatile devices are depicted as pairs of simple switches, which either connect or disconnect an associated product term or its complement through the appropriate N-channel transistor. It should also be noted that, in this disclosure, the complement of a digital signal value is denoted by the signal value followed by an asterisk. For example, the complement of I is I*. In the example of FIG. 4, the logical operation of $X = I_0 I_1{}^* I_2$ is implemented by programming switches SW0B, SW1A and SW2B as closed, and switches SW0A, SW1B and SW2A as open. When inputs $I_0$ and $I_2$ are high, and input $I_1$ is low, node X1 will be pulled high by the current source $I_s$, and the output X will be high; for other input values, X will be low. This method of constructing AND arrays has inherent disadvantages. Unless transition detection circuits are added to the inputs, power is consumed during static states whenever the product term in not matched (i.e., the inputs are other than high, low, and high, respectively). With transition detection on the inputs, zero power drain is achieved except when inputs are toggled. Otherwise, the current source $I_s$ is turned off a short time after the inputs are toggled and after the output X has latched. The current source $I_s$ is turned back on whenever any of the inputs are retoggled. Although the addition of transition detection circuitry achieves a substantially zero power device, device performance is compromised with a reduction in speed. Typical PALs having no transition detection circuitry have access times on the order of 10–20 nanoseconds, and power dissipation greater than 100 mA. With the addition of transition detection circuitry, zero power dissipation is achieved for static states, but with a rise in access time to around 25 nanoseconds.

What is needed is a high-speed, zero power logic cell which may be used to construct both PALs or FPLAs.

SUMMARY OF THE INVENTION

This invention fulfills the previously stated need for a high-speed, zero power logic cell which may be used to construct both PALs and FPLAs. The cell is constructed from first and second pairs of P-channel insulated-gate field effect transistors (IGFETs), and first and second pairs of N-channel IGFETs. Each pair of P-channel IGFETS is connected in series between an output node and $V_{cc}$, while each pair of N-channel IGFETS is connected in series between the output node and $V_{ss}$. The gate of one transistor of the first P-channel IGFET pair is connected to the output of a first memory cell, while the gate of the other transistor of the same pair is connected to an input signal I; the gate of one transistor of the second P-channel IGFET pair is connected to the output of a second memory cell, while the gate of the other transistor of the same pair is connected to signal I*. Likewise, the gate of one transistor of the first N-channel IGFET pair is connected to the output of the first memory cell, while the gate of the other transistor of the same pair is connected to signal I*; the gate of one transistor of the second N-channel IGFET pair is connected to the output of the second memory cell, while the gate of the other transistor of the same pair is connected to signal I. Each of the memory cells may be programmed to provide either a CMOS logical 1 or 0 output, and may be either nonvolatile (e.g., fuse, antifuse, EPROM or EEPROM) or volatile (e.g., 6-transistor SRAM cell or CMOS latch). If the memory cells are volatile, their logic states can be defined during power up from an array of nonvolatile elements that are either internal or external to the logic device. CMOS logical 1 and 0 voltages are generally regarded as being 3.3–5 volts ($V_{cc}$) and 0 volts ($V_{ss}$), respectively.

PREFERRED EMBODIMENT OF THE INVENTION

Figure 1:
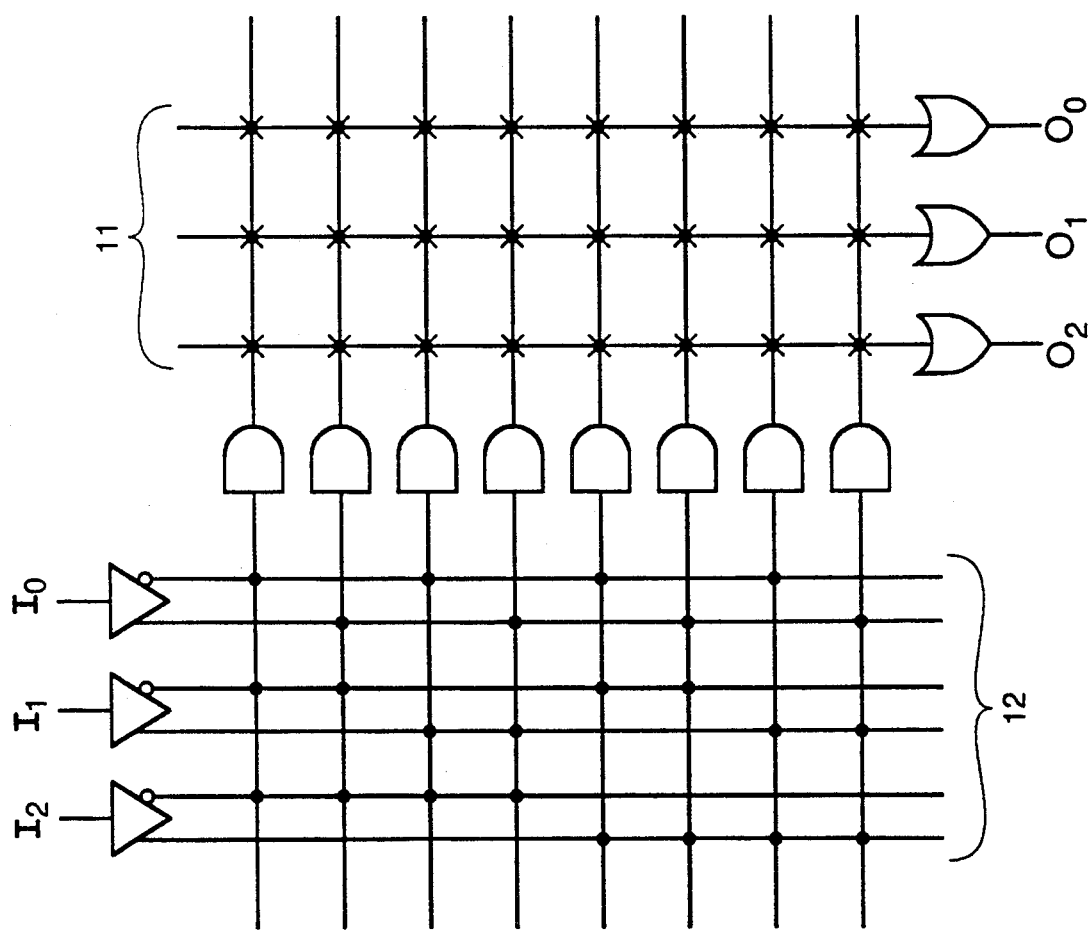
FIG. 1 is a simplified logic diagram of a typical Programmable Read-Only Memories (PROM)
Figure 2:
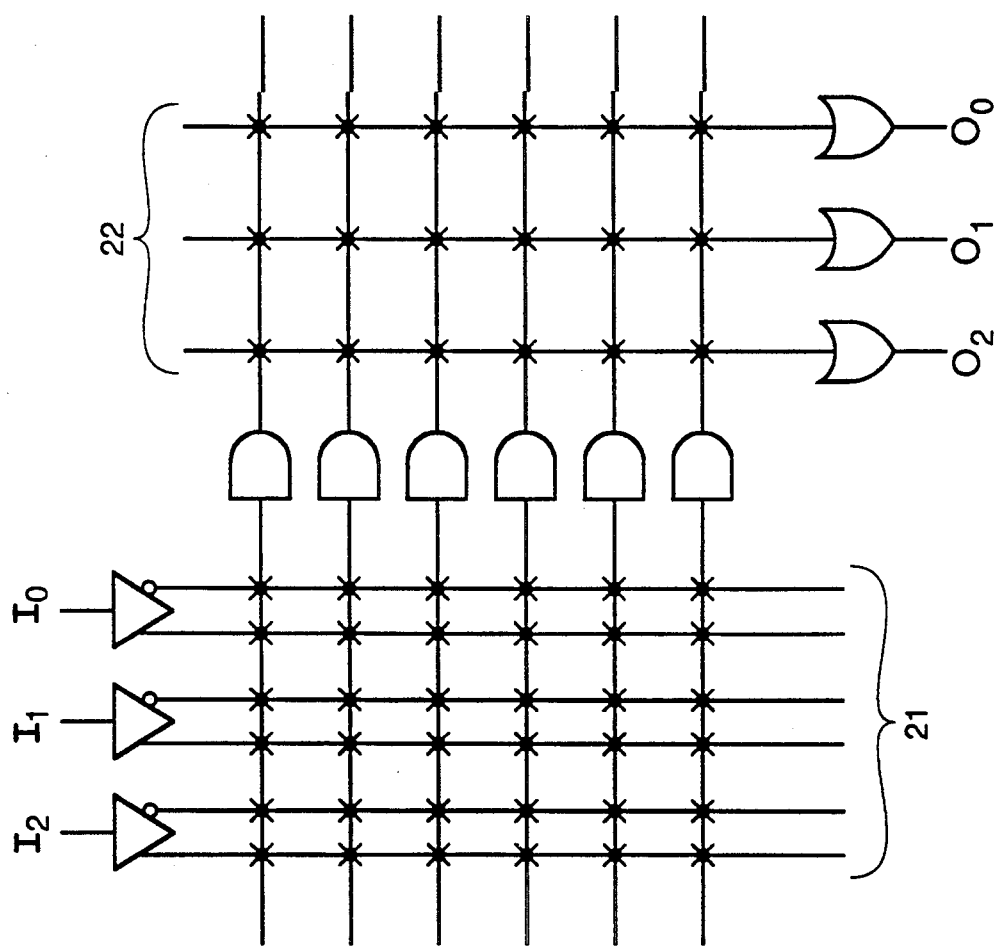
FIG. 2 is a simplified logic diagram of a typical Field Programmable Logic Array (FPLA)
Figure 3:
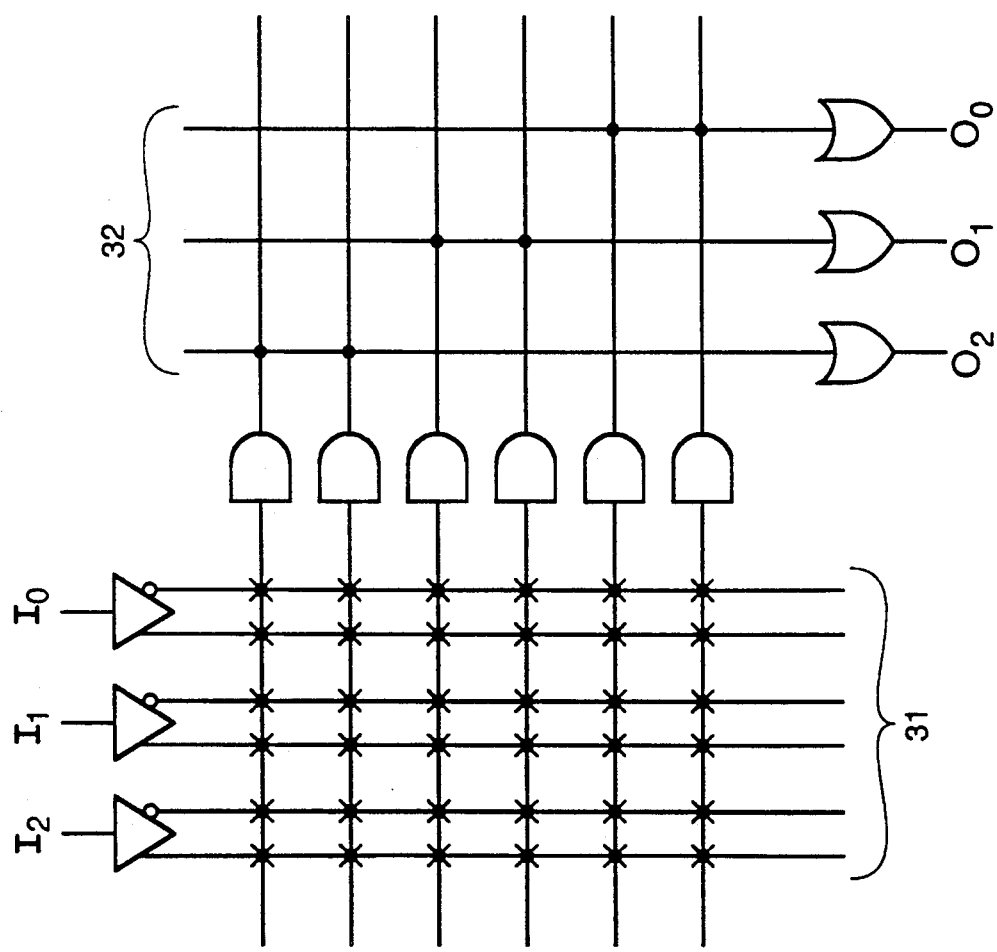
FIG. 3 is a simplified logic diagram of a typical Programmable Array Logic (PAL)
Figure 4:
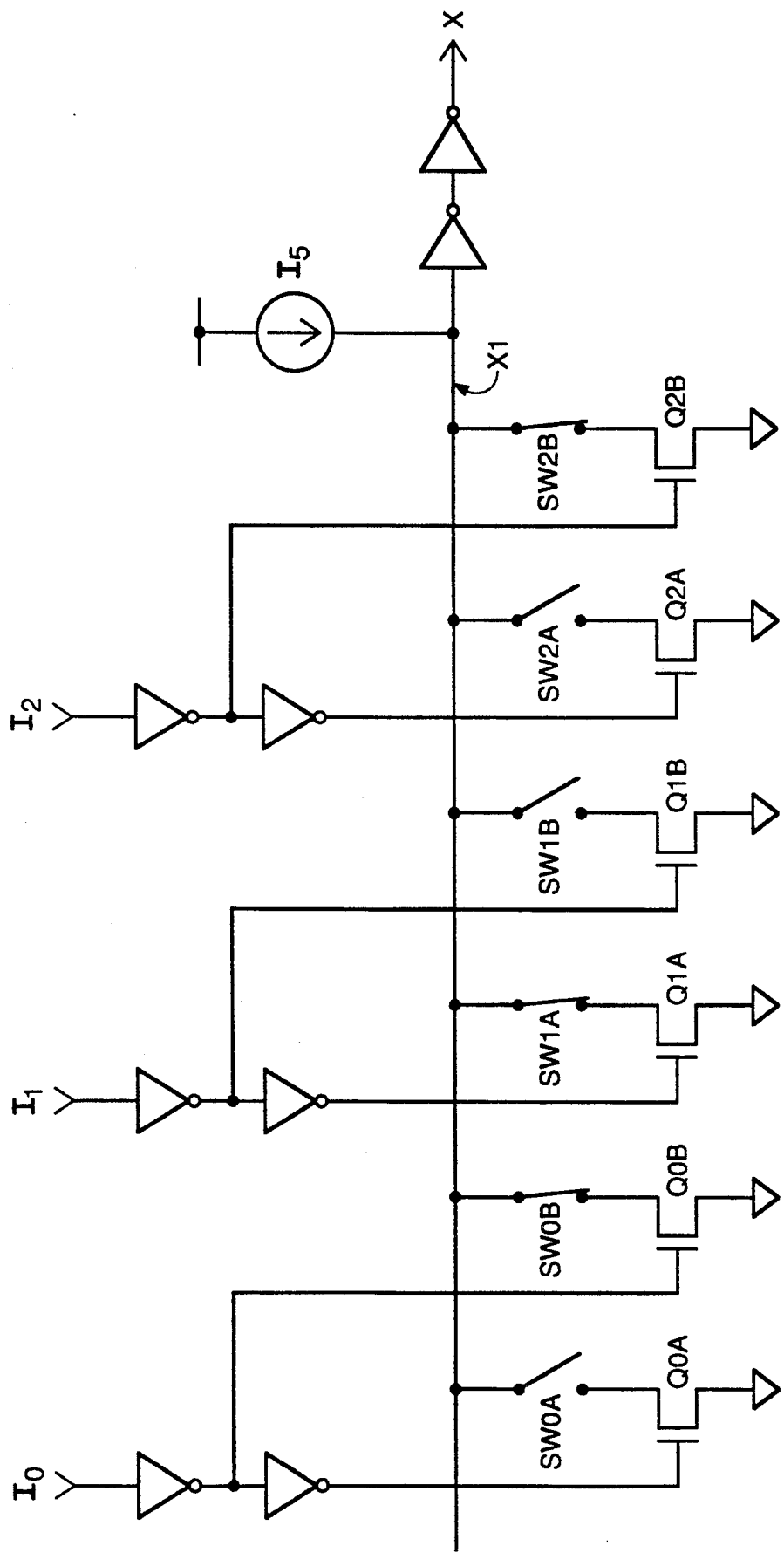
FIG. 4 is a simplified logic diagram for a 3-input AND architecture that is typical of conventional FPLAs and PALs.
Figure 5:
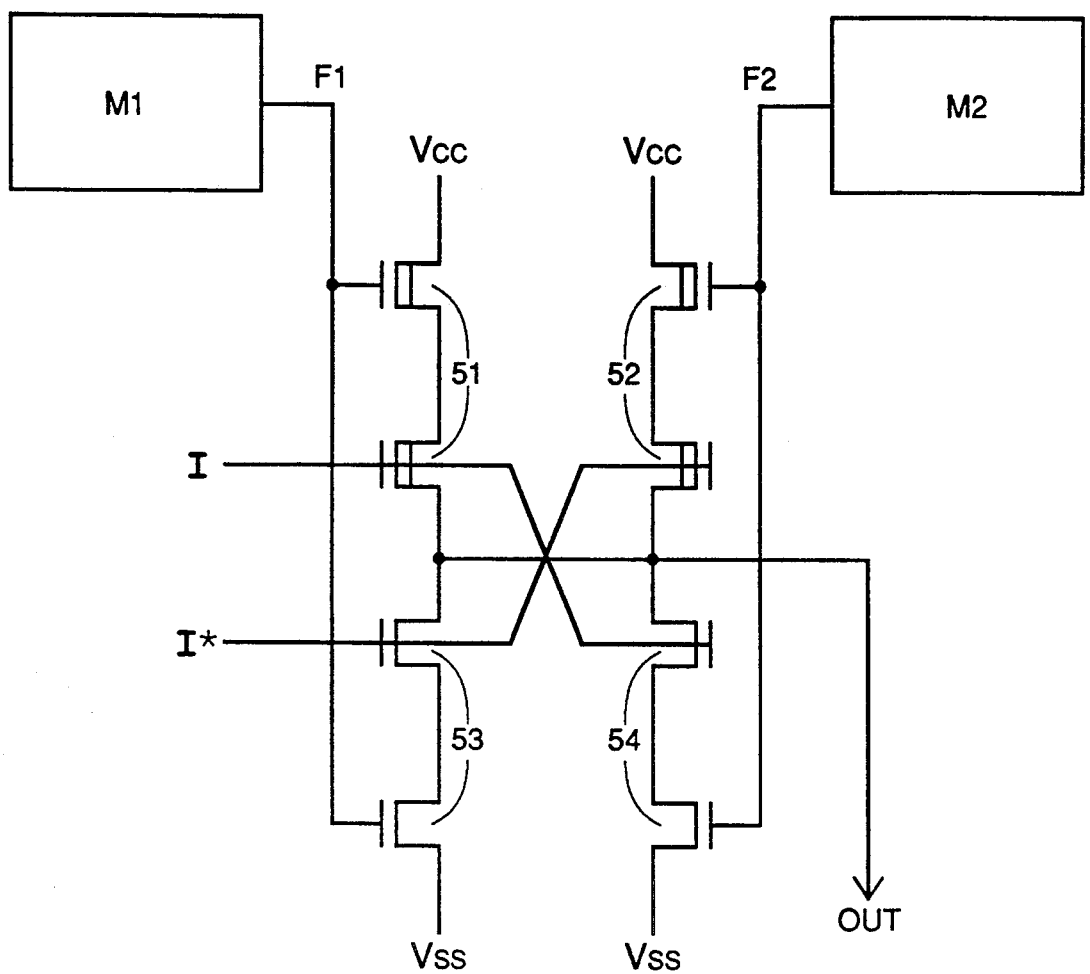
FIG. 5 is a circuit schematic for a first embodiment of the new programmable CMOS logic cell.

A first embodiment of the new zero-power, programmable CMOS logic cell is depicted in schematic form in FIG. 5. The cell is constructed from a first P-channel IGFET pair 51, a second P-channel IGFET pair 52, a first N-channel IGFET pair 53, and a second N-channel IGFET pair 54. Each pair of P-channel IGFETS is connected in series between an output node OUT and $V_{cc}$, while each pair of N-channel IGFETS is connected in series between output node OUT and $V_{ss}$. The gate of one transistor of the first P-channel IGFET pair 51 is connected to the output F1 of a first memory cell M1, while the gate of the other transistor of the same pair is connected to an input signal I; the gate of one transistor of the second P-channel IGFET pair 52 is connected to the output F2 of a second memory cell M2, while the gate of the other transistor of the same pair is connected to signal I*. Likewise, the gate of one transistor of the first N-channel IGFET pair 53 is connected to the first memory cell output F1, while the gate of the other transistor of the same pair is connected to signal I*; the gate of one transistor of the second N-channel IGFET pair 54 is connected to the second memory cell output F2, while the gate of the other transistor of the same pair is connected to signal I. Each of the memory cells may be programmed to provide either a CMOS logical 1 or 0 output, and may be either nonvolatile (e.g., fuse, antifuse, EPROM or EEPROM) or volatile (e.g., 6-transistor SRAM cell or CMOS latch). If the memory cells are volatile, their logic states can be defined at power up from an array of nonvolatile elements that are either internal or external to the logic device. CMOS logical 1 and 0 voltages are generally regarded as being 3.3-5 volts ($V_{cc}$) and 0 volts ($V_{ss}$), respectively. It should be understood that $V_{cc}$ and $V_{ss}$ for the cell may be different than power supply voltage and ground, respectively.

Still referring to FIG. 5, in the preferred embodiment of the invention, the signal lines carrying I and I* are connected to the gates of the inner four transistors (i.e., those which are directly connected to output node OUT). This permits greater device speed and lower power consumption, particularly if the channel width of the outer transistors (i.e., those which are directly connected to either $V_{cc}$ or $V_{ss}$) is larger and, preferably, at least twice that of the inner transistors. Such a design results in reduced capacitive and parasitic loading for signal inputs I and I* and lessens the importance of the outer transistors as a factor in transition times for changes in output signal state.

Table 1 is a truth table which provides cell output values (i.e., logical functions) for various programmed values of F1 and F2:

TABLE 1

| F1 | F2 | OUT |
|----|----|-----|
| 0 | 0 | 1 |
| 0 | 1 | I* |
| 1 | 0 | I |
| 1 | 1 | 0 |

Figure 6:
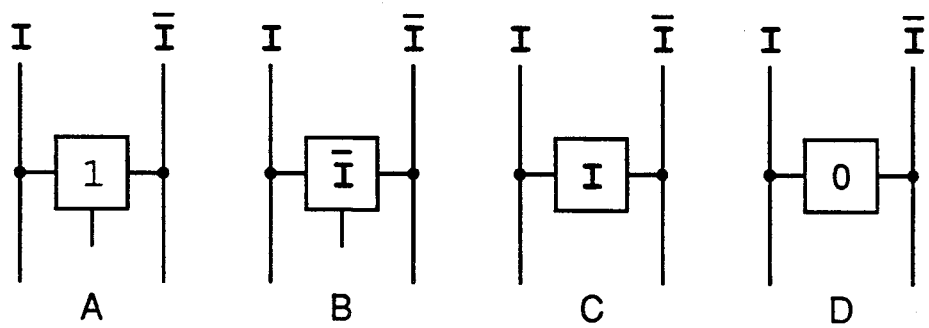
FIGS. 6A-6D are symbolic representations of the four programmable logic states of the new CMOS logic cell.

The logical functions 1, I*, I, and 0 will be used hereinafter to represent the four possible programmed states of the cell. FIG. 6A represents the first state, where the programmed output (OUT) is equal to 1; FIG. 6B represents the second state, where OUT is equal to I*; FIG. 6C represents the third state, where OUT is equal to I; and FIG. 6D represents the fourth state, where OUT is equal to 0 (zero).

Figure 7:
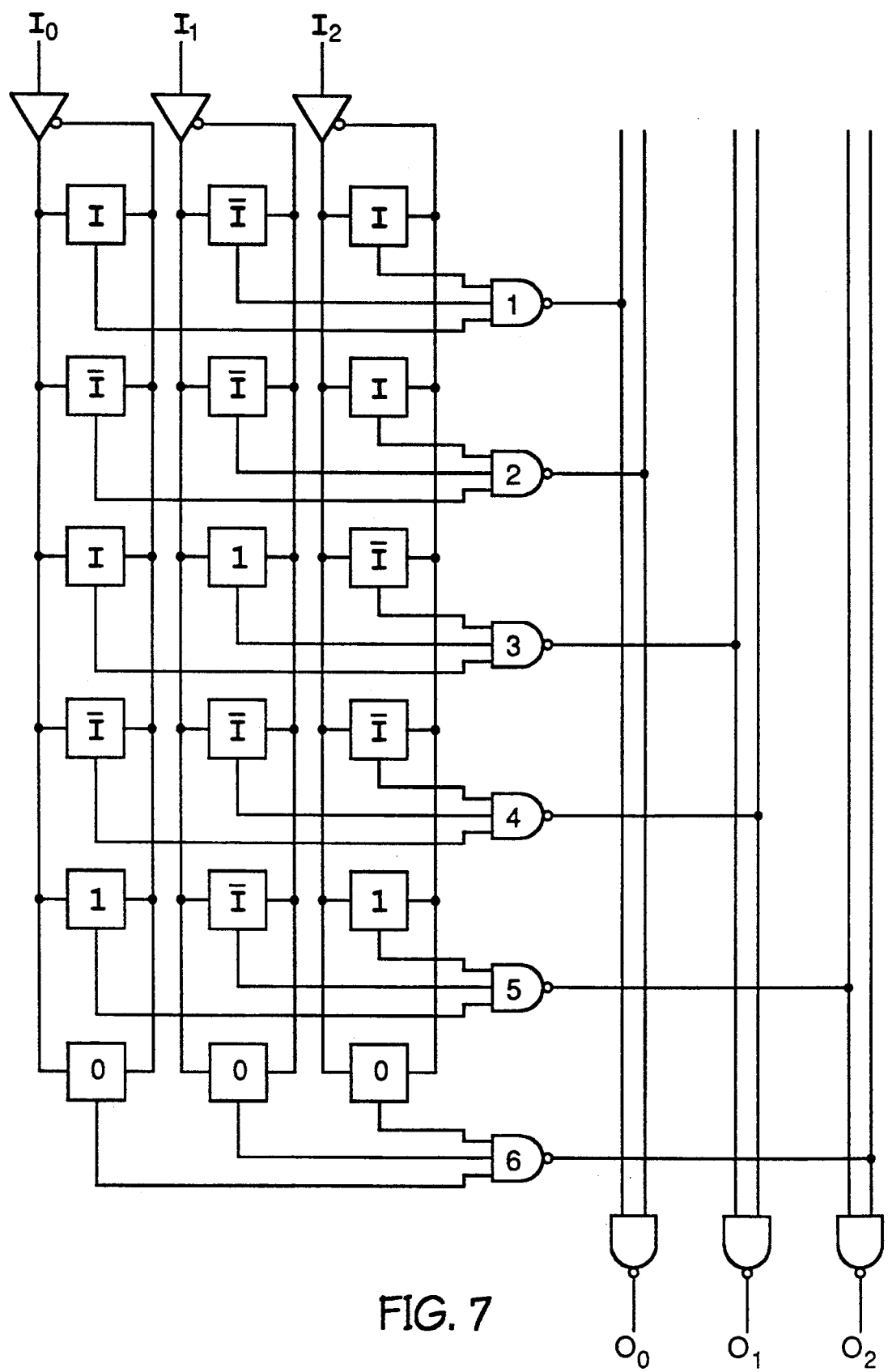
FIG. 7 is a logic diagram of a simple 3-input, 3-output PAL device in which the AND array is constructed using the new CMOS logic cell as a basic building block.

Referring now to FIG. 7, nine of the new CMOS logic cells have been incorporated as basic building blocks in the AND array of a simple 3-input, 3-output PAL device. Each of the logic cells has been programmed to provide a logical function in accordance with Table 1. The programmed logic state of each cell is represented as heretofore depicted in FIGS. 6A-6D. Three functions are implemented in this device: The first is $O_0 = I_0 I_1 * I_2 + I_0 * I_1 * I_2$; the second is $O_1 = I_0 I_2 * + I_0 * I_1 * I_2 *$; and the third is $O_2 = I_1 *$.

It will be obvious to one having ordinary skill in the art of logic design that the new CMOS logic cell may be used to construct an OR array where inputs to the array and their complements are present. Using FIG. 7 as an example, if an inverter placed in series with each of the inputs $I_0$, $I_1$, and $I_2$, the result would be an OR function at the outputs of gates 1 through 6.

Figure 8:
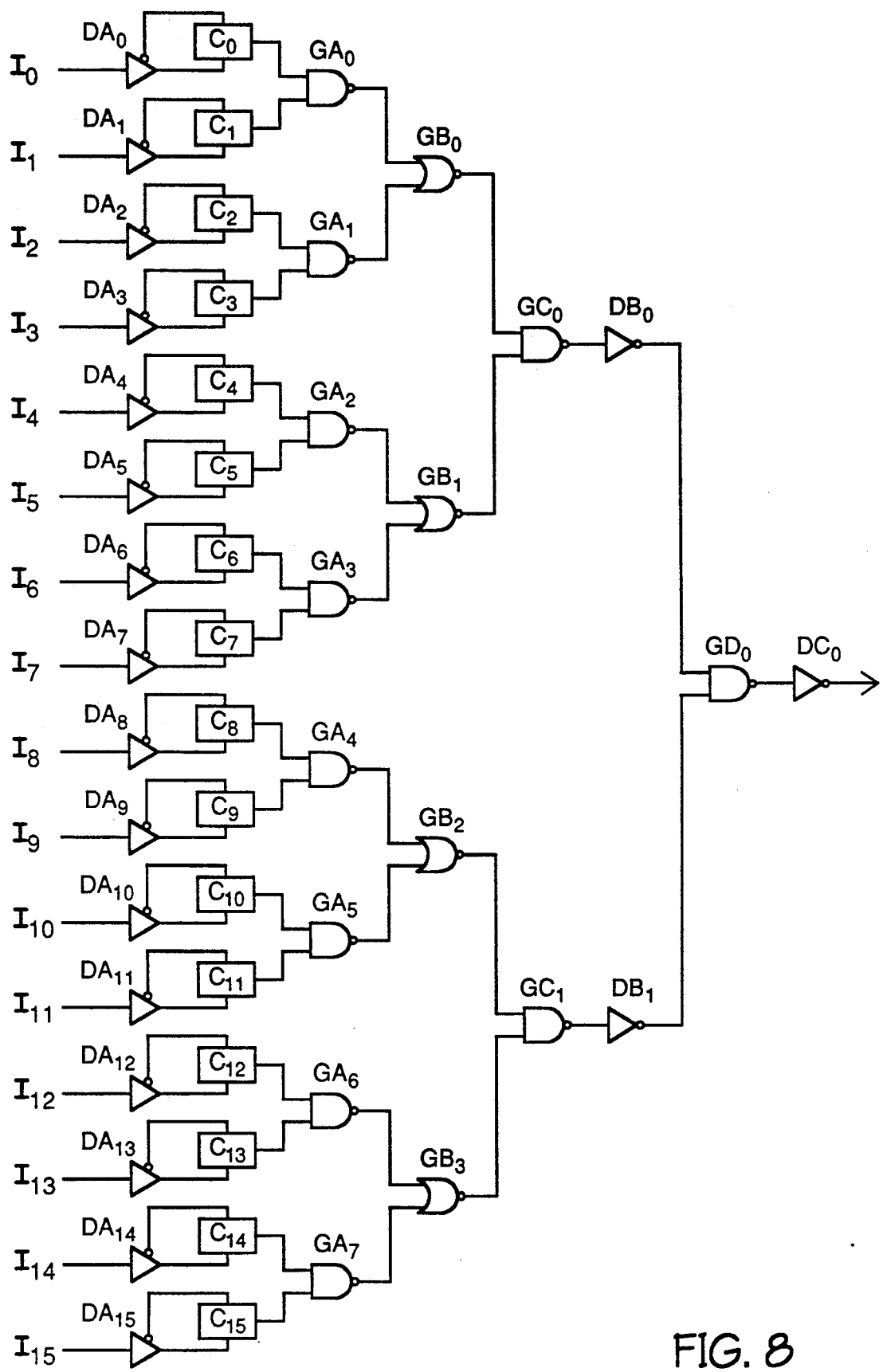
FIG. 8 is a logic diagram which depicts how the new CMOS logic cell may be incorporated in an AND array having 16 inputs and a single output.

Referring now to FIG. 8, the architecture of a single row of a 16-input AND array which utilizes sixteen of the new CMOS logic cells ($C_0$ through $C_{15}$) as basic building blocks, and which may be incorporated in the AND array of either a FPLA or a PAL, is shown. The sixteen inputs are consecutively labeled $I_0$ through $I_{15}$. Each input is fed to primary inverting and non-inverting drivers $DA_0$ through $DA_{15}$. Thus an input signal and its complement are fed to a single logic cell. The logic function of each logic cell $C_0$ through $C_{15}$ is, of course, programmed by an associated pair of memory cells, which are not depicted in this logic diagram. The outputs from adjacent pairs of logic cells are fed to one of a first series of eight NAND gates ($GA_0$ through $GA_7$). The outputs from adjacent pairs of said first series of NAND gates $GA_0$ through $GA_7$ are fed to one of a series of four NOR gates ($GB_0$ through $GB_3$). In turn, outputs from adjacent pairs of the NOR gates are fed to one of a pair of a second series of NAND gates ($GC_0$ and GC₁). The output from each of the second series of NAND gates is fed to one of a pair of secondary inverting drivers DB₁ and DB₂, from whence the signals are fed to a single final NAND gate GD₀. The output from NAND gate GD₀ is passed through a final inverting driver DC₀. A distinct advantage of this logic architecture is that the transistors required to construct the gates required for this particular implementation of the AND function may be tucked between the logic cells, resulting in very densely-packed array. In order to incorporate multiple 16-input rows into an expanded AND array, the input and input complement lines run perpendicular to the rows, and the lines which interconnect the various gates run parallel to the rows.

Figure 9:
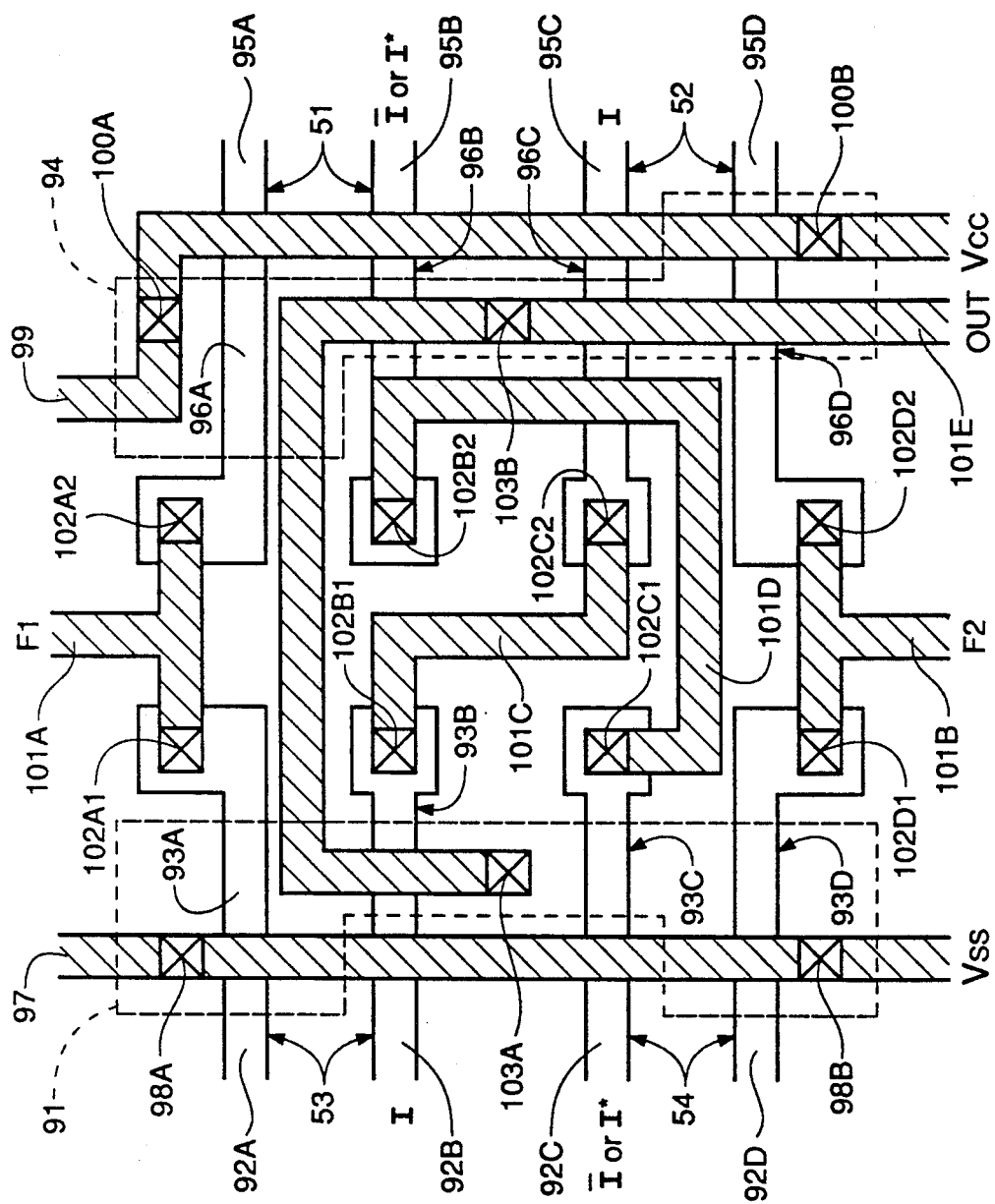
FIG. 9 is a top plan view of a preferred layout for the cell of FIG. 5.

Referring now to FIG. 9, a preferred layout for the new CMOS logic cell is depicted. An N-channel active area 91, in combination with a first N-channel gate electrode 92A, a second N-channel gate electrode 92B, a third N-channel gate electrode 92C, and a fourth N-channel gate electrode 92D form a first N-channel IGFET 93A, a second N-channel IGFET 93B, a third N-channel IGFET 93C, and a fourth N-channel IGFET 93D, respectively. Input signals I and I* are brought to N-channel gate electrodes 92B and 92C, respectively. A P-channel active area 94, in combination with a first P-channel gate electrode 95A, a second P-channel gate electrode 95B, a third P-channel gate electrode 95C, and a fourth P-channel gate electrode 95D form a first P-channel IGFET 96A, a second P-channel IGFET 96B, a third P-channel IGFET 96C, and a fourth P-channel IGFET 96D, respectively. In conventional contemporary semiconductor circuitry, gate electrodes are patterned from a layer of polycrystalline silicon and insulated from the active areas by a layer of gate oxide (not shown). Additionally, the N-channel active area 91 would be created within a P-well, while the P-channel active area 94 would be created within an N-well. In this layout, neither of those wells are shown. Furthermore, it should be explained that a layer of field oxide covers the array in areas outside the active areas. Thus, all gate electrodes overlie both active area and field oxide regions. A metal $V_{ss}$ bus 97 makes contact with the N-channel active area 91 via a first $V_{ss}$ contact 98A and a second $V_{ss}$ contact 98B. A metal $V_{cc}$ bus 99 makes contact with the P-channel active area 94 via a first $V_{cc}$ contact 100A and a second $V_{cc}$ contact 100B. A first metal strap 101A, which is in electrical communication with programming signal F1, makes contact with both N-channel gate electrode 92A and P-channel gate electrode 95A via contacts 102A1 and 102A2, respectively. Likewise, a second metal strap 101B, which is in electrical communication with programming signal F2, makes contact with both N-channel gate electrode 92D and P-channel gate electrode 95D via contacts 102D1 and 102D2, respectively. A third metal strap 101C interconnects N-channel gate electrode 92B and P-channel gate electrode 95C via contacts 102B1 and 102C2, respectively, and a fourth metal strap 101D interconnects N-channel gate electrode 92C and P-channel gate electrode 95B via contacts 102C1 and 102B2, respectively. A metal output strap 101E, which makes contact with the N-channel active area between N-channel gate electrode 92B and 92C and with the P-channel active area between P-channel gate electrode 95B and 95C via output contacts 103A and 103B, respectively. It should be noted that the metal layer from which $V_{ss}$ bus, $V_{cc}$ bus, and metal straps 101A–101E are patterned is separated from the polysilicon layer from which the gated electrodes were patterned by an isolation dielectric layer.

Figure 10:
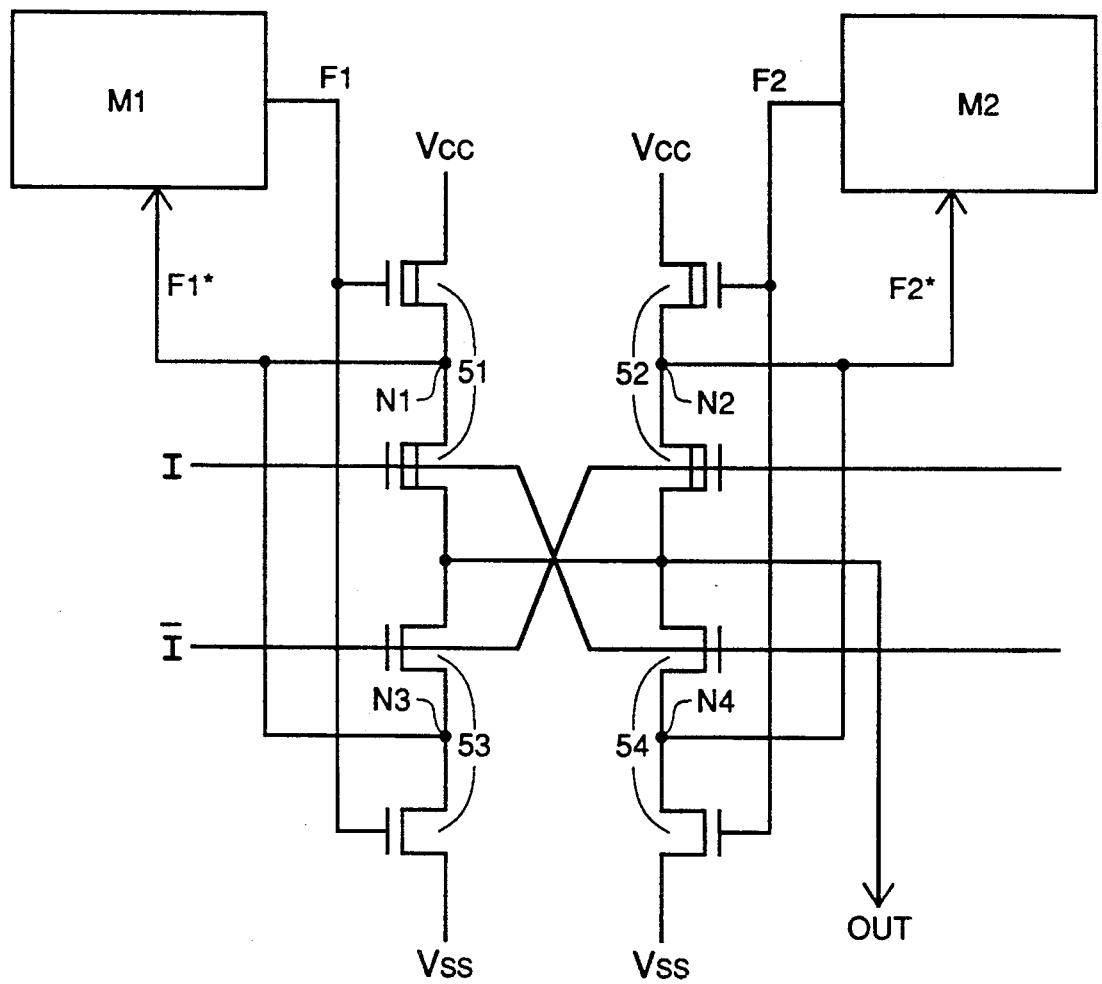
FIG. 10 is a circuit schematic for a second embodiment of the new programmable CMOS logic cell.

Referring now to FIG. 10, a second embodiment of the new CMOS logic cell is depicted. In this embodiment, source/drain region N1, that is common to the first P-channel IGFET pair 51, is tied to source/drain region N3, that is common to the first N-channel IGFET pair 53. The tying of N1 and N3 results in signal F1*, which is the complement of signal F1. Likewise, source/drain region N2, that is common to the second P-channel IGFET pair 52, is tied to source/drain region N4, that is common to the second N-channel IGFET pair 54. The tying of N2 and N4 results in signal F2*, which is the complement of signal F2. Each complement may be fed back to its associated cell as shown diagramatically. Such an arrangement is particularly useful if the memory cell is a CMOS latch (e.g., an SRAM cell). The only proviso in such a design is that I and I* signals must be switched simultaneously in order to avoid a significant increase in switching current.

Figure 11:
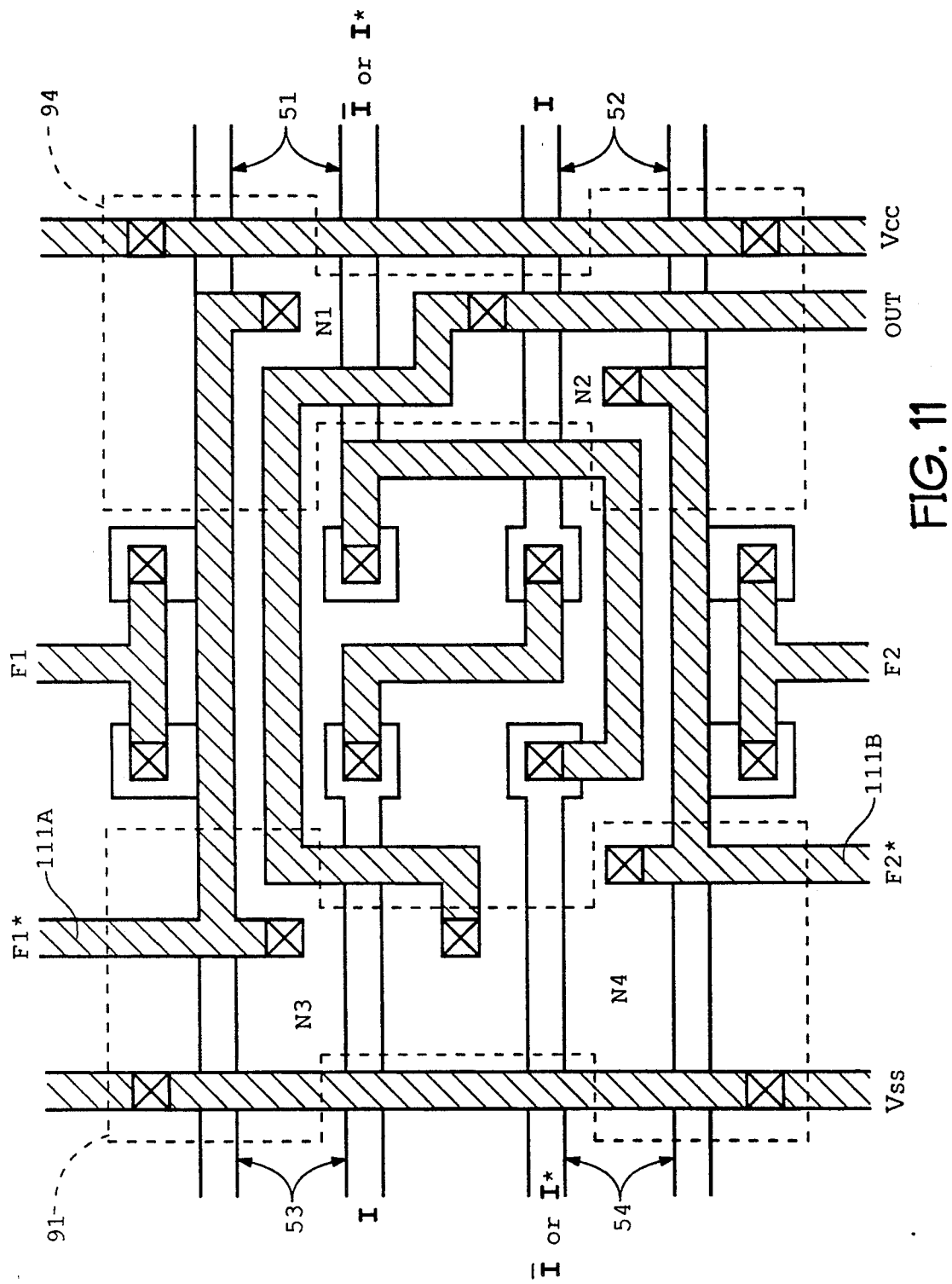
FIG. 11 is a top plan view of a preferred layout for the cell of FIG. 10.

FIG. 11 depicts a modification of the layout of FIG. 9 in order to accommodate the tied nodes which distinguish the second embodiment of FIG. 10 from the first embodiment of FIG. 5. The modification consists of the addition of a first metal tying strap 111A and a second metal tying strap 111B. Strap 111A ties node N1 to node N3 and strap 111B ties node N2 to node N4.

Although only several embodiments of the invention have been disclosed herein, it will be obvious to those having ordinary skill in the art of semiconductor logic design that changes and modifications may be made thereto without departing from the spirit and scope of the invention as claimed. Referring to FIG. 5, for example, in the interest of speed and power minimization, the preferred way of connecting the first embodiment of the cell is to connect the signals I and I* to the transistors nearest the output node (OUT), as shown. However, a workable, though inferior cell can be constructed by connecting signals I and I* to the transistors farthest from the OUT node and the memory cell output signals nearest the OUT node. Likewise, workable, though inferior cells can also be constructed by connecting signals I and I* in many other asymmetric patterns (e.g., with signal I connected to either of the transistors within transistor pair 51 and either of the transistors within transistor pair 54, and with I* connected to either of the transistors within transistor pair 53 and either of the transistors within transistor pair 52). Additionally, various other gate configurations may be used to implement the 16-input AND array function described in FIG. 8.

I claim:

1. A CMOS logic cell for programmable logic devices comprising:
   first and second pairs of P-channel IGFETs, each pair of which is connected in series between an output node and $V_{cc}$; and
   first and second pairs of N-channel IGFETs, each pair of which is connected in series between the output node and $V_{ss}$;
   the gate of one transistor of the first P-channel IGFET pair being connected to the output of a first memory cell, the gate of the other transistor of the same pair being connected to an input signal I, the gate of one transistor of the second P-channel IGFET pair being connected to the output of a second memory cell, and the gate of the other transistor of the same pair being connected to signal a complement of input signal I; and the gate of one transistor of the first N-channel IGFET pair being connected to the output of the first memory cell, the gate of the other transistor of the same pair being connected to the complement of signal I, the gate of one transistor of the second N-channel IGFET pair being connected to the output of the second memory cell, and the gate of the other transistor of the same pair being connected to signal I.

2. The CMOS logic cell of claim 1, wherein the output of each of the memory cells may be programmed to provide either a CMOS logical 1 or 0 output.

3. The CMOS logic cell of claim 2, wherein logic state of each memory cell is nonvolatile.

4. The CMOS logic cell of claim 2, wherein the logic state of each memory cell is field programmable.

5. The CMOS logic cell of claim 2, wherein the logic state of each memory cell is volatile.

6. The CMOS logic cell of claim 2, wherein the transistor of each IGFET pair which is gated by the signal I or its complement is the one closest to the output node.

7. The CMOS logic cell of claim 2, wherein the channel width of each of the transistors which is not gated by the signal I or its complement is larger than that of each of the transistors which is gated by the signal I or its complement.

8. The CMOS logic cell of claim 7, wherein the channel width of each of the transistors which is not gated by the signal I or its complement is at least twice that of each of the transistors which is gated by the signal I or its complement.

9. The CMOS logic cell of claim 8, wherein the channel width of each of the transistors which is not gated by the signal I or its complement is between 2 and 3 times that of each of the transistors which is gated by the signal I or its complement.

10. The CMOS logic cell of claim 2, wherein said logic cell is one of a plurality of identical interconnected cells within the AND array of a programmable array logic device.

11. The CMOS logic cell of claim 2, wherein said logic cell is one of a plurality of identical interconnected cells within the AND array of a field-programmable logic array.

12. The CMOS logic cell of claim 2, wherein said logic cell is one of a plurality of identical interconnected cells within an AND array of a programmable logic device.

13. The CMOS logic cell of claim 2, wherein said logic cell is one of a plurality of identical interconnected cells within an OR array of a programmable logic device.

14. The CMOS logic cell of claim 2, wherein $V_{cc}$ is at a potential other than an external power supply voltage.

15. The CMOS logic cell of claim 2, wherein $V_{ss}$ is at a potential other than ground.

16. The CMOS logic cell of claim 2, wherein the transistor of each IGFET pair which is gated by the signal I or its complement is the one closest to the output node, and a source/drain region of the first P-channel IGFET pair is tied to a source/drain region of the first N-channel IGFET pair, thus providing a first resultant signal that is the complement of the output of the first memory cell, and a source/drain region of the second P-channel IGFET pair is tied to a source/drain region of the second N-channel IGFET pair, thus providing a second resultant signal that is the complement of the output of the second memory cell.

17. The CMOS logic cell of claim 16, wherein the first resultant signal is fed back to said first memory cell, and the second resultant signal is fed back to said second memory cell.

18. The CMOS logic cell of claim 17, wherein the output of the first memory cell and the first resultant signal are employed to provide a latching function within said first memory cell, and the output of the second memory cell and the second resultant signal are employed to provide a latching function within said second memory cell.

19. The CMOS logic cell of claim 17, wherein the channel width of each of the transistors which is not gated by the signal I or its complement is larger than that of each of the transistors which is gated by the signal I or its complement.

20. The CMOS logic cell of claim 19, wherein the channel width of each of the transistors which is not gated by the signal I or its complement is at least twice that of each of the transistors which is gated by the signal I or its complement.

21. The CMOS logic cell of claim 20, wherein the channel width of each of the transistors which is not gated by the signal I or its complement is between 2 and 3 times that of each of the transistors which is gated by the signal I or its complement.

22. The CMOS logic cell of claim 17, wherein said logic cell is one of a plurality of identical interconnected cells within the AND array of a programmable array logic device.

23. The CMOS logic cell of claim 17, wherein said logic cell is one of a plurality of identical interconnected cells within the AND array of a field-programmable logic array.

24. The CMOS logic cell of claim 17, wherein said logic cell is one of a plurality of identical interconnected cells within an AND array of a programmable logic device.

25. The CMOS logic cell of claim 17, wherein said logic cell is one of a plurality of identical interconnected cells within an OR array of a programmable logic device.

* * * * *